Dec. 2, 1958 E. P. THIAS 2,863,058

TELEVISION TUNER MECHANISMS

Filed July 11, 1955 5 Sheets-Sheet 1

INVENTOR.
EDWIN P. THIAS
BY
Ostrolenk, Faber, Gerb & Soffen
ATTORNEYS

TELEVISION TUNER MECHANISMS

Filed July 11, 1955 5 Sheets-Sheet 2

INVENTOR.
EDWIN P. THIAS

BY Ostrolenk, Faber, Gerb & Soffen
ATTORNEYS

TELEVISION TUNER MECHANISMS

Filed July 11, 1955 5 Sheets-Sheet 3

INVENTOR.
EDWIN P. THIAS
BY Ostrolenk, Faber, Gerb & Soffen
ATTORNEYS

Dec. 2, 1958 E. P. THIAS 2,863,058

TELEVISION TUNER MECHANISMS

Filed July 11, 1955 5 Sheets-Sheet 4

INVENTOR.
EDWIN P. THIAS

BY Ostrolenk, Faber, Gerb & Soffen

ATTORNEYS

Dec. 2, 1958 E. P. THIAS 2,863,058

TELEVISION TUNER MECHANISMS

Filed July 11, 1955 5 Sheets-Sheet 5

INVENTOR.
EDWIN P. THIAS

BY Ostrolenk, Faber, Gerb & Soffen
ATTORNEYS

United States Patent Office 2,863,058

Patented Dec. 2, 1958

2,863,058

TELEVISION TUNER MECHANISMS

Edwin P. Thias, Los Angeles, Calif., assignor to Standard Coil Products Co., Inc., Los Angeles, Calif., a corporation of Illinois Application July 11, 1955, Serial No. 521,205

6 Claims. (Cl. 250—20)

This invention relates to improvements in tuning devices for television receivers, and more particularly relates to novel features in television channel selectors resulting in more compactness, ruggedness and simpler construction thereof.

In accordance with the present invention, the fine tuning mechanism control for operating the television tuner is located externally of the chassis, and arranged to operate a novel fine tuning capacitance arranged fully within a shielded tuner chassis. Effective control of such variable tuning capacitance is afforded in a stable and efficient manner without radiation of energy from the oscillator or other tuner section emanating through the condenser control mechanism of the invention.

The invention further encompasses a novel detent mechanism operable at the central portion of the front tuning control, and arranged in a rugged, inexpensive construction. The invention detent mechanism fully insulates and electrically isolates the metallic tuning control shaft from internal portions of the tuner, and from the detent assembly. The invention detent mechanism also serves as a bearing for the tuning control shaft, and shields the tuning shaft from internal radiations.

In accordance with the present invention, a novel spring-type lever is actuated at one end by a spiral groove arranged external of the chassis, and the lever extends internally of the tuner with an arm that is utilized as one plate of the variable capacitance constituting the fine tuning unit. The novel lever herein is pivoted in the chassis frame astride of the central shafts and detent, isolating the internal integral capacitance from the exterior. The fine tuning-lever mechanism herein is compact, simple and effective, and affords any desired fine tuning characteristics over the television frequency band.

The aforesaid novel detent mechanism and fine tuning device are usable in any type of frequency selector, or television tuner, such as of the wafer switch or turret types. The exemplary embodiments of the invention as set forth herein are in connection with the rotary wafer switch-type tuner. However, it is understood that the turret, or other type of selector, may embody such units as described without departing from the broader aspects and scope of the invention.

The novel television tuner of the present invention further incorporates significant improvements in rotary wafer switch constructions, which constitutes a continuation-in-part of my co-pending patent application Serial No. 511,227, filed on May 25, 1955, and assigned to the same assignee as the present case.

The rotary wafer switch constructions of the prior art, such as used for incremental tuners and otherwise, consisted of a plurality of spring clip contacts mounted in an arcuate fashion about a composition base. A rotatable slip ring or center conductor, with a protruding tip, engaged the spring clips selectively in accordance with its angular position. Contact was accordingly directly established between the center ring and any one of the mounted spring clips which the ring tip engaged. A further contact was arranged to suitably engage the center ring conductor, whereby electrical connection was afforded therefrom to the external circuitry.

For example, in a twelve-channel V. H. F. television tuner, twelve of such spring clips were spacedly mounted about a circular or annular segment, with the contact ring centrally thereof. The group of twelve spring clips and slip ring contactor comprised a circuit section of the tuner. V. H. F. twelve-position tuners commonly have at least four of such circuit sections: one for the antenna input circuit; another for the antenna amplifier output circuit; another for the grid input circuit of the mixer stage; and finally a circuit for the oscillator section, tunable to each of the twelve channels.

The spring clips used on the prior art electrical wafer switches are relatively small elements that have to be accurately shaped and designed with special attention to its required spring tension. The jaws of such spring clips coact with the flat tip of the rotor that passes between the jaws. It is readily apparent that the alignment of the spring clips on the fixed panel or stator is relatively critical to ensure uniform contact pressure with the rotor blade or tip. The composition stator or wafer is suitably perforated and each spring clip is mounted in such perforation by a rivet, eyelet, or equivalent member.

Not only need the angular position of each spring clip be accurate about the stator, but its own alignment in the radial direction with respect to the rotor blade is also important. This will be apparent when it is realized that the rotor of the tuner is detented for each channel position and accordingly comes to rest at the predetermined angular channel positions about the stator. Should, for any reason, a pair of co-acting jaws of a spring clip be displaced from its predetermined angular channel position, its prescribed contacting coaction with the rotor blade would not take place. Minimal or in some cases no connection at all would occur, causing arcing or inoperation of the associated circuit. Further, light contacting tends to build up film and dirt that further inhibits optimum performance of the electrical circuits.

Another important shortcoming of the prior electrical wafer switches involves the tedious assembly thereof that did not lend itself to the labor-saving and accuracy of construction afforded by mass production and automation. For example, in a twelve-position wafer switch, the prior designs required a rivet, eyelet or equivalent member for each of the separate spring clips. Each spring clip had a definite spring tension designed into it and had peculiar arcuate shapes, and had to be mounted in a predetermined angular relation for suitable contacting with the rotor tip. Thus, twenty-four small elements had to be assembled in accurate position and alignment about the stator.

The present invention eliminates the need for such twenty-four separate small components by substituting only one component in their stead. Furthermore, the construction of the invention wafer assembly with such single sizeable component is performed automatically, eliminating all possible error of alignment, placement or distortion in assembly, as will be set forth in detail hereinafter.

Further deficiencies of the prior electrical wafer switches involved their progressive deterioration with age and usage. For example, the spring tension of the tiny switch clips often would deteriorate during wide temperature ambients wherein connection between the spring clips and the rotor blade could not be assured. Then again, constant usage of switch wafers tended to angularly displace the spring clips about their riveted or eyelet mountings. Since such spring clips are designed to have an optimum contact pressure with the rotor blade when in the predetermined detent position, displacement of any spring clip from its predetermined angular relationship on the stator reduced or avoided suitable electrical contact pressure between the spring clip and the rotor blade. Finally, a well-used prior art wafer switch had weakened or cracked spring material at the small element clips and rendered the whole wafer switch useless.

In accordance with the present invention, a rugged electrical wafer switch is provided having rigid flat plates at each of the plurality of switch points. These rugged contacting plates or planes are located at the detented angular positions about the stator and correspond to the individual circuits required of the switch; in the case of a V. H. F. tuner, twelve. In the invention tuner, the rotor is essentially an insulation disc and does not carry the electrical slip ring as in the prior art counterpart switch. A metal annular ring is located in the vicinity and spacedly from the fixed switch plates and is supported by the same stator as are the switch plates, in a manner to be further detailed hereinafter.

A novel spring contactor is carried by the rotor that establishes positive electrical interconnection between any desired switch contact plate and the fixed metal ring. In this manner the rotor with the single contactor connects any one of the plurality of fixed plates with the stationary "collector ring." The single spring contactor between the switch plates and the collector ring is the only movable electrical element.

The spring contactor is made rugged in design, sufficient to withstand any range of ambient temperature, vibration, etc., encountered in the field by the device utilizing the invention switch. There is no "jaw" action corresponding to the prior art spring clip-rotor blade coaction. Misalignment of any of the switch blades in the invention device will in no way deteriorate the electrical connection between such blades and the switch contactor. The flatness of the stationary blades affords identical electrical contacting pressure at any angular distortion possible in the field. Furthermore, one version of the present invention eliminates the need for eyelets and rivets but instead the contact blades are provided with projecting lugs punched and formed from the body of the contact, by means of which the blades are attached directly to the stator to afford a most rigid positioning thereof.

In a preferred form of the invention, all the switch plates are formed in a single metallic sheet, with ribs interjoining each of the plates. The interjoining ribs hold each of the plates in a definite predetermined relationship in their arcuate angular positions about the stator. Furthermore, each switch plate is perforated or otherwise slotted to provide integral lugs projecting therefrom, which become the fastening devices anchoring the stamping to the stator molding.

The plurality of lugs project from the single metallic stamped plate sheet and are secured to the stator to constitute the switch-stator of the invention unit. By severing the interconnecting ribs, the distinct contact plates remain individual and duly fastened in their predetermined positions on the insulating support. In the exemplary embodiment of the invention herein, the inductance coils for the higher V. H. F. channels, namely 7 through 13, constitute the interconnecting ribs between the switch plates thereof; such interconnecting inductance ribs remaining in the final wafer switch, as will be set forth in detail.

The "connecting" ring of the invention wafer switch is secured to the stator and remains fixed throughout the operating conditions of the wafer switch. The collector ring herein is sufficiently spaced from the switch plates on the stator as to minimize and make negligible possible capacitance therebetween. Also the rotor disc is designed such as to minimize possible capacity effects between the switch plates and/or with the collector ring.

Thus, higher gain in the tuner circuit is afforded with a minimum capacitance between the switch blades, the rotor, and the collector ring of the wafer switch herein.

A further important feature herein is the captivation of the rotor disc and spring contactor within the stator assembly. The spring contactor of the wafer switch herein is mounted on the rotor, between the switch plates projecting from the stator and the collector ring on the opposite side. The collector ring is secured to the stator and serves to captivate the rotor between the switch plates and the collector ring, all within the molded angular stator as will be set forth in detail hereinafter. Thus, the mechanical arrangements, the mountings and the electrical operation of the wafer switch of the present invention are all predetermined, pre-adjusted and integrally handled in the device in which it is used.

It is accordingly an object of the present invention to provide novel television tuner mechanisms, lending toward increased ruggedness and inexpensive fabrication.

A further object of the present invention is to provide a novel fine tuning device for television tuners in conjunction with a central detent mechanism.

Another object of the present invention is to provide a novel fine tuning mechanism of rugged construction and enhanced stability of operation.

Still another object of the present invention is to provide a novel fine tuning mechanism for television tuners that is readily assembled and serviced.

A further object of the present invention is to provide a novel fine tuning device for a television tuner, the electrical portion of which is fully internal of the tuner and shielded, and which is fully operable from the front end outside of the tuner.

Another important object of the present invention is to provide a novel detent mechanism incorporated centrally at the front end of a television tuner.

A further object of the present invention is to provide a novel detent tuner mechanism that isolates the tuning control shaft of the tuner electrically from the tuner circuit, and constitutes an integral bearing for such control shaft.

Still another object of the present invention is to provide a novel detent mechanism for television tuners that secures the control shaft to the tuner, and fully electrically isolates such shaft, and further shields the shaft electrically from radiations within the tuner.

Still a further object of the present invention is to provide a novel electrical wafer switch having only a single spring contact for a plurality of fixed rigid electrical blades.

Another object of the present invention is to provide a novel electrical wafer switch that maintains electrical contact between its collector ring and a plurality of switch blades, despite vibration and wide temperature variation; and which is self-adjusting under all operating conditions to provide firm electrical interconnections.

The above and further objects of the present invention will become more apparent from the following detailed description of an exemplary embodiment of a television tuner including the novel features hereof, taken in connection with the drawings in which Figure 1 is a front view, in elevation, of a television tuner, with interior portions associated with the front end thereof indicated as well.

Figures 1, 2:
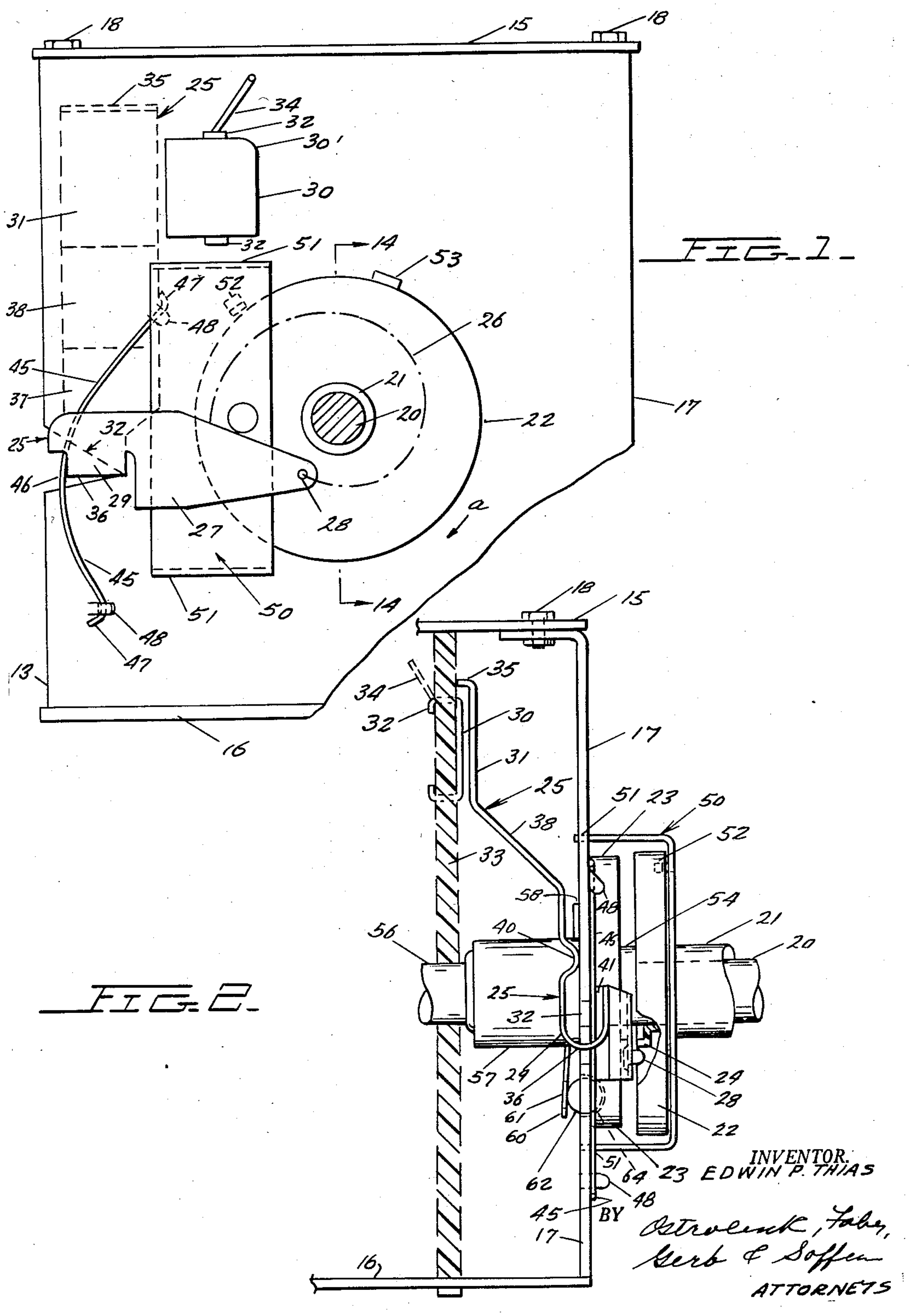
Figure 2 is an end view in elevation, partially in section, of the television tuner of Figure 1, illustrating an exemplary fine tuning mechanism and detent device for the tuner.

Referring now to Figure 1, the exemplary television tuner embodiment includes top chassis plate 15, bottom chassis plate 16, with front end chassis plate 17 secured therebetween. Self-tapping screws 18, 18 are used at the top section of vertical front tuner plate 17 to secure it to top plate 15. The metallic chassis plates 15, 16 and 17, in combination with side and end chassis plates (not shown), constitute the tuner shielding assembly and the structural body of the tuner to which all the components are secured or otherwise mounted.

Extending from the front of the tuner is the control shaft 20, located centrally of the tuner and extending through a central opening in front chassis plate 17. The tuning shaft 20 is the control shaft which is secured to a knob outside the television cabinet (not shown), and is used to change the position of the electrical tuner components internal thereof for operation at various desired channels, such as any one of channels 2 through 13 when designed for V. H. F. reception.

The channel frequency bands, 6 megacycles wide, are in the exemplary tuner selected in discrete steps, as is conventional for switch type and turret tuners. Concentric about central control shaft 20 is sleeve shaft 21 serving as the fine tuning shaft, the operation of which is set forth in more detail hereinafter.

Figure 2 is an end view of the tuner embodiment shown in Figure 1 and illustrates the front end section of the tuner only, to more particularly set forth the invention features of the fine tuning mechanism and detent device. The remainder of the tuner may take any desirable form or construction as to both the electrical and mechanical portions thereof, and are not shown in the illustrations for the sake of clarity of presentation. Mounted centrally of the front plate 17 of the tuner, and exterior thereof, is a fine tuning disc 22 and a detent disc 23. Discs 22 and 23 are preferably made of insulation material, and in the exemplary embodiment are made of nylon molded to the desired form.

The fine tuning disc 22 is firmly secured to, and rotates with, the fine tuning shaft 21. Fine tuning disc 22 is fully and directly rotatable with fine tuning shaft 21 to which it is secured. The fine tuning shaft 21 terminates just beyond the interior of disc 22 at end 24. The end 24 of fine tuning shaft 21 is peened over to firmly secure disc 22 with sleeve shaft 21. (See also Figure 14.)

An important feature of the present invention is the novel fine tuning system arranged to circumvent the front and centrally positioned detent-bearing device, and translate the rotary action external of the tuner to suitable fine tuning inside the tuner. A compound lever 25 is operated by disc 22 that is rotated by fine tuning shaft 21. Lever 25 affords a fine tuning variable capacitance at its internal end, as will now be set forth, and subtends detent disc 23.

Lever 25 co-acts with a spiral groove 26 on the internal face of disc 22, and transmits such displacement to the interior of the tuner as a variable condenser member 31 co-acting with a fixed plate 30. Lever 25 is fully illustrated in Figures 3 through 6 and will be described in detail hereinafter. As seen in assembly Figures 1 and 2, an arm 27 of lever 25 contains a pin 28 that rides in the spiral groove 26. The central body portion 29 of lever 25 serves as a pivot to translate the motion of arm 27 to its internal condenser end 31 thereof. The pivoting of lever portion 29 is on plate 17 across the notched section 32, 32 thereof.

The flat end 31 of compound lever 25 is arranged opposite the flat metallic plate 30 to constitute a variable fine tuning capacitance therewith for the tuner. The shape, area and spacing of the respective plates 30, 31 are formulated to provide desired condenser parameters, as will be understood by those skilled in the art.

The extent of motion of movable condenser plate 31 with respect to fixed plate 30 to effect the capacitance variations desired over the tuning range is initiated by a corresponding motion of extending arm 27 and pin 28 controlled by the groove 26 in disc 22. The co-action and capacitance variation due to the movement of lever arm 31 under the control of the fine tuning shaft 21 and spiral groove 26 are more fully set forth in connection with diagrammatic Figures 7 through 13 hereinafter.

The lever 25, including its condenser portion 31, is made of spring metal, is conductive, and connects to ground potential through its direct and continuous physical contact with the chassis front plate 17 across notch 32, 32. The companion fixed condenser plate 30 is mounted by projecting lugs 32, 32 extending integrally from plate 30 through an insulation mounting, such as unit 33. Unit 33 schematically constitutes rotary wafer switch assembly section, as more fully set forth in Figures 18 through 20 hereinafter.

The wafer switch assembly 33 herein constitutes the oscillator section of the tuner, and affords a short connection of metallic condenser plate 30 through lead 34 to the oscillator circuit upon which the fine tuning condenser 30, 31 is effective. It is thus noted that fixed condenser plate 30 is insulatedly mounted in the tuner, and co-acting movable condenser arm 31 is grounded.

The connection by lead 34 constitutes a variable fine tuning condenser to the oscillator of the tuner. In an exemplary embodiment, lead 34 is connected to a tap on the oscillator coil to afford a more uniform fine tuning action over all the V. H. F. television. The connection of the fine tuning condenser 30, 31 to the oscillator, or other circuit portions of the tuner, may take any desired or circuital arrangement. The essential feature herein is the provision of a novel fine tuning condenser for such fine tuning circuit controllable in predetermined manner from the exterior of the television tuner to the condenser (30, 31) located fully within the shielded tuner to avoid radiation effects therefrom.

It has been found that the fine tuning mechanism of the present invention can be constructed to afford substantially uniform and linear fine tuning for all the twelve V. H. F. channels by proper proportioning of the size, shape and spacing of condenser plates 30, 31. Suitable connection of condenser 30, 31, is through lead 34 to the oscillator tank circuit.

In a particular embodiment, lead 34 was connected somewhat down on the inductance coil of the oscillator to afford a greater effect due to the capacity change for the lower frequency channels, e. g., 2 to 6, since the action of capacity 30, 31 is more effective for the higher frequency channels 7 through 13.

As is clearly shown in Figure 2, the tip end 35 of lever 25 abuts the insulation surface of wafer 33, and constitutes a means for insuring a predetermined spacing of condenser arm 31 with respect to fixed plate 30. Such spacing by tip 35 of lever 25 is afforded throughout the movements of the lever, for all positions of condenser arm 31 as determined by movement of pin 28 in the spiral channel or groove 26. The aforesaid spacing between condenser plates 30, 31 is maintained under all conditions of operation despite vibration, impact, or wide ambient temperature change. The design of lever 25 for this purpose assures such predetermined spacing and maintenance thereof despite differences in dimensions of the components of the tuner assembly during manufacture, including for example, the thickness of the chassis plate 17 and also even of the material with which lever 25 is fabricated. Towards this end the lever 25 is made of suitable spring material.

As will be more fully set forth in connection with Figures 3 to 6, loop 36 at body portion 29 creates a spring action on the internal portion of lever 25, including its vertical section 37. The angular section 38 and the contiguous condenser arm 31 constitute a spring biased lever portion held in position with respect to wafer 33 and plate 30 by arcuate tip 35. Further, a curved projection 40 extends from the central vertical section 37 of lever 25 to abut the vertical chassis plate 17 as seen in Figure 2. The combined spring action of lever 25 due to the built-in curvature at 29 and 36, and the action of curved projection 40 and tip end 35, maintains parallelism and spacing of lever condenser arm 31 with respect to fixed condenser plate 30 in a predetermined relationship under all conditions of operation that the tuner may encounter. Such co-action affords stability of predetermined capacity values and parameters with angular rotation of fine tuning shaft 21.

A similar stabilizing action is afforded by the remaining section of lever 25 through curved projection 41 (similar to projection 40) in the exterior arm 27 of lever 25. Projection 41 abuts the outside face of vertical chassis frame 17. The outward biasing of projecting arm 27 towards grooved disc 22, in conjunction with projection 41, assures pin 28 to continually be pressed against the spiral groove 26 in which it rides. A more detailed presentation and illustration of the spring action and curvatures (36, 40, 41) of the lever 25 for the aforesaid functions is made in connection with detailed Figures 3 through 6 thereof, hereinafter.

The further stabilizing element in the invention fine tuning mechanism constitutes the wire spring 45 abutting central body 29 of lever 25 at its edge 46. The ends 47, 47 of spring 45 are curved-over and grip about lugs 48, 48 notched from chassis base 17. The spring 45 is held by the lugs 48, 48 in contact against the edge 46 of lever 25, in a smooth spring biasing arrangement that does not inhibit the motion or tilting of the lever due to the action of groove 26 on its pin 28.

The curvature of wire or leaf spring 45 at its central portion that co-acts with lever 25 at edge 46, generally corresponds to the curvature that edge 46 executes in its tilting action due to the oscillation of body portion 29 in the groove 32, 32 of panel 17. The action of spring 45 is to stabilize the assembly incorporating the compound lever 25 and secure it in its operative relationship to the vertical chassis panel 17 for its function in varying the capacity at the "hot" condenser plate 30 through the grounded co-acting plate 31 of lever 25 integrally related to the arm 27 motivated by groove 26 through pin 28.

A final member of the fine tuning assembly is stop plate 50. Plate 50 is essentially a U-bracket, the ends 51, 51 of which are secured to vertical panel 17 in a suitable fashion. For example, the ends 51, 51 of U-bracket 50 contain individual notches placed within corresponding slots of chassis panel 17, and are maintained in such slots by a spring bow imparted in the bracket 50. On the other hand, suitable lips or bracket 50 ends, with screw fastening to plate 17, may be employed. It is desirable that panel 50 be removably supported on chassis plate 17, for ready servicing after initial assembly of the mechanism embraced therein.

The stop bracket 50 encompasses a segment of both the fine tuning disc 22 and the detent disc 23, as shown in Figures 1 and 2. Bracket 50 is displaced with respect to the central shafts 20, 21 passing through discs 22, 23. One purpose of the bracket 50 is to provide an outward end position for disc 22. Since disc 22 is rotatably about control shaft 20 with fine tuning shaft 21, it is thus maintained within its desired position to insure continuous engagement of pin 28 with groove 26 of the disc 22.

A further function of the bracket 50 is to provide a stop for the extent of rotation of fine tuning disc 22, and thus of its associated fine tuning shaft 21. Such stop action is accomplished by punching an ear 52 out at the proper location in the surface of U-bracket 50 to co-act with a projection 53 on peripheral surface of fine tuning disc 22 (see Figure 1). By suitably locating projection 53, the extent of rotation of disc 22 is arrested at the end of its fine tuning cycle by the fixed projecting ear 52. Should an additional projection or stop be desired, for the other end of the operating cycle of disc 22, it is readily incorporated.

A further important feature of the present invention is the detent mechanism for operation of the tuner selection means. The novel detent mechanism is incorporated at the front end of the tuner section centrally with the control shaft 20. The detent system herein provides integrally therewith a bearing for the control shaft (20), and further advantageous features illustrated and detailed hereinafter in connection with Figures 14 to 17.

Figure 2 illustrates the detent disc 23 with hub portion 54 extending to, and contiguous with, the rolled-over end 24 of fine tuning shaft 21; and a longer hub 55 (Figures 14 and 16) extending at the opposite end thereof. The function of hub 55 of detent disc 23 is to join control shaft 20 to the disc 23, and also to an extension shaft 56 that operates the internal mechanism of the tuner. A metallic sleeve 57 subtends hub 55 to hold the structure firmly together and to maintain the detent spring 58 in position against vertical chassis plate 17.

The spring lip 60 extending from spring 58 has an opening 61 that co-acts with a segment of a steel ball 62 extending through opening 63 of the chassis frame 17 selectively into notches or cavities 64 of detent disc 23. As the position of sphere 62 is fixed, the rotation of control shaft 20 carries detent disc 23 with it, and is interrupted at the successive cavities 64 of disc 23 as they selectively engage steel ball 62.

In this manner the discretely arranged circuit components of the tuner, at the corresponding detented angular positions, are actuated through internally extending control shaft 56 carried by disc 23. By fabricating detent disc 23, and its associated hubs 54, 55 of insulation material and employing an insulated shaft 56, the main metallic control shaft 20 is fully insulated electrically from the internal section of the tuner. Also, the metallic sleeve 57 electrically shields the end of shaft 20 co-acting in hub 55, as is set forth in more detail in connection with Figure 14 hereinafter.

Figures 3 to 6 are enlarged illustrations of the compound lever 25 as incorporated in the tuner embodiment illustrated in Figures 1 and 2. While lever 25 is set forth to accomplish the desired functions and end results of translating the rotational fine tuning motion of shaft 21 into a corresponding variable capacitance value across "hot" plate 30, it is to be understood that modifications in lieu of member 25 may be used towards such end. To clearly set forth the function and operation of the lever 25, these detailed figures thereof (Figures 3 to 6), taken in conjunction with assembly Figures 1 and 2 utilizing lever 25, are herein set forth.

Figure 3:
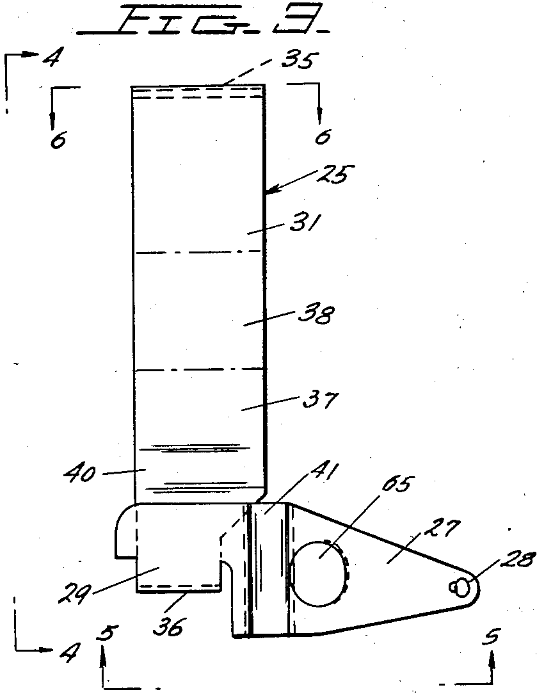
Figure 3 is an enlarged face view of the novel lever for the fine tuning mechanism.
Figure 4:
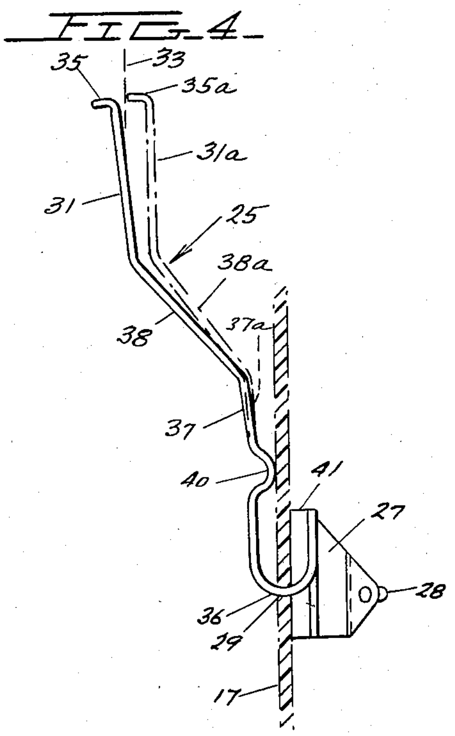
Figure 4 is an end view of the lever of Figure 3, as seen in the direction of arrows 4—4 in Figure 3.

The full face view of lever 25, shown in Figure 3, illustrates the grooves 40 and 41 that co-act with the chassis vertical plate (17), and in general defines the lever 25 as outlined in Figure 1. The lever arm 27 projects laterally of the body of the lever that contains spring sections 37, 38 and capacity arm 31. An opening or hole 65 is used in arm 27 to enhance its spring action, whereby pin 28 carried by arm 27 is maintained in continuous engagement with the co-acting groove 26 of disc 22. Figure 4, in solid lines, illustrates the curvature or spring factor incorporated in the lever design prior to its assembly in the tuner as seen in Figure 2. The dotted-line position of the body sections 37*a*, 38*a* and 31*a* of lever 25 corresponds to the assembled position of the lever with its tip 35*a* against the surface of wafer 33.

As indicated in Figure 4, and illustrated in the assembly Figure 2, the grooved section 40 of the lever rides against the co-acting surface of vertical chassis plate 17. Correspondingly, the grooved portion 41 of the external section of the lever, contiguous with arm 27, rides on the outside surface of the chassis plate 17 and permits the lever 25 assembly to hug and otherwise ride against the surfaces of the vertical chassis plate 17, with its extending arms performing their requisite functions.

Figure 5:
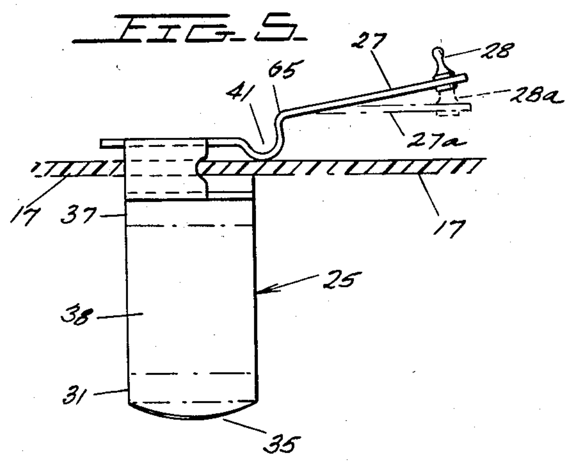
Figure 5 is a bottom view of the lever of Figure 3 as seen in the direction of the arrows 5—5 in Figure 3.

Similarly, Figure 5 illustrates the extension of arm 27 with its built-in springiness bringing to the solid line position of Figure 5. The dotted position 27*a* of the arm 27 with the corresponding pin position 28*a* corresponds to its assembled position such as seen in Figure 2 with pin 28 resting in the spiral groove 26. The grooved portion 41 in this section of the lever 25 serves to formulate the spring bias in the arm 27 and to ride against the corresponding outer face of chassis plate 17.

Figure 6:
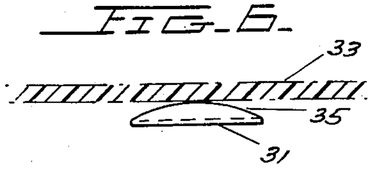
Figure 6 is an end view of the lever of Figure 3 as seen in the direction of the arrows 6—6 in Figure 3.

Figure 6 illustrates the riding action of the arcuate lip 35, extending from the condenser arm 31 of the lever 25 against the co-acting surface of the insulated wafer 33 or equivalent insulated riding surface provided internally of the tuner.

Figures 7 through 11 are diagrammatic illustrations of the action of lever 25 in response to rotation of fine tuning shaft 21, controllably varying the capacitance of "hot" plate 30 connected to the tuner circuit, such as to the oscillator plate thereof by lead 34. As described hereinabove in connection with Figures 1 and 2, the spiral groove 26 is in disc 22 that is rotatably secured to sleeve shaft 21, constituting the fine tuning actuator.

Figures 7, 8:
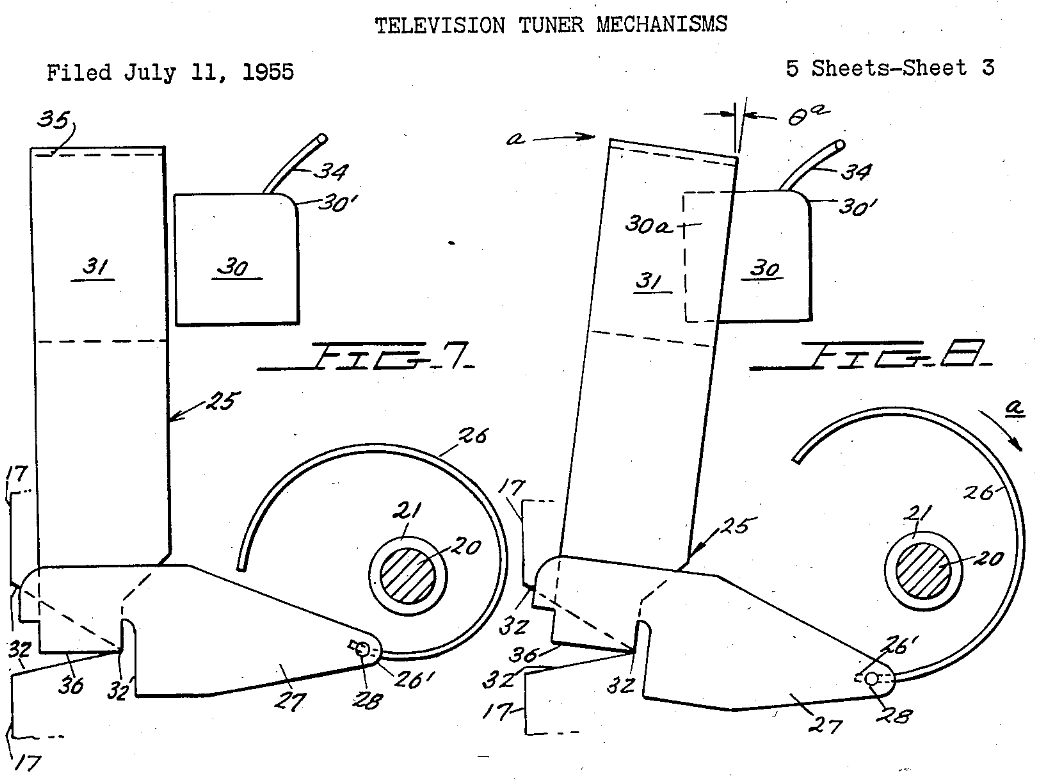
Figure 7 is a diagrammatic representation of the fine tuning mechanism of Figures 1 and 2 in the extreme position of its operation.
Figures 8 through 11 are further diagrammatic representations of further operative positions of the fine tuning mechanism beyond the extreme position of Figure 7.

Figure 7 illustrates the vertical position of the lever 25 with its condenser arm section 31 removed from co-acting relationship with the fixed condenser plate 30. The pin 28 is at one end 26′ of groove 26. The central portion 36 of lever 25 co-acts in notch 32, 32 of the chassis frame 17 in the pivotal fashion hereinabove described. The apex 32′ of notch 32, 32 acts as the pivotal bearing point for the lever 25 set in the notch.

Figure 8 illustrates the displacement of lever 25 due to a clockwise rotation of fine tuning shaft 21, and its accompanying spiral groove 26 in the direction of the arrow *a*. The "rise" of the spiral 26 is proportioned to controllably angularly displace lever 25 through pin 28 at its tip. The displacement of the vertical condenser section 31 of lever 25 follows in view of the pivotal action at notch 32, 32 of the lever, and in Figure 8 is displaced by $\theta^a$ degrees. Such displacement of lever 25 brings the condenser arm 31 thereof into an overlapping capacitive co-action with fixed plate 30. Such co-acting section is indicated in dotted at 30*a*. As will be further described in connection with Figures 9, 10 and 11, the degree of overlapping between plates 30 and 31 is controlled by the rise and extent of angular displacement of pin 28 by the predetermined spiral groove 26. The greater the overlapping between plates 30 and 31, the greater the resulting capacity, as is understood by those skilled in the art.

Figures 9, 10, 11:
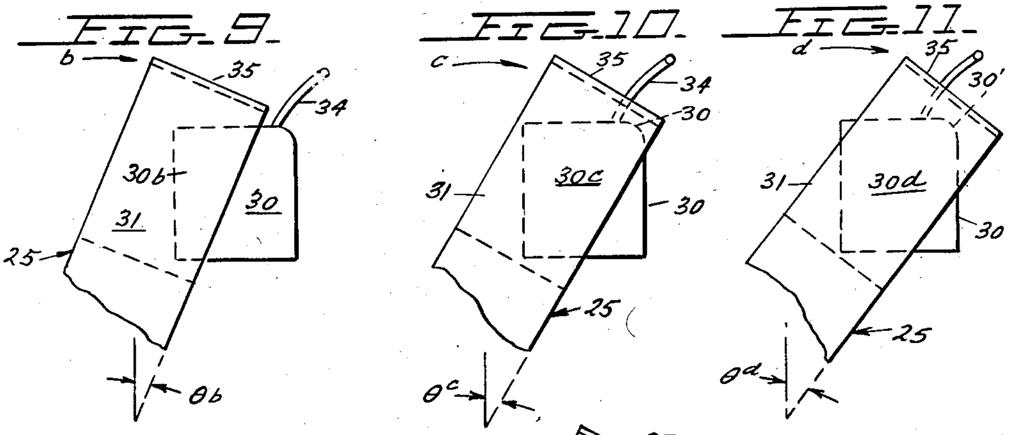

Figure 9 diagrammatically illustrates the position of condenser arm 31 further along in its displacement by the spiral groove 26 to the angular position $\theta^b$. The displacement of the lever 25 in the direction of arrow *b* affords a greater resultant capacity between fixed plate 30 and pivoted condenser arm 31, as indicated by the greater subtended area $30^b$ shown in dotted, as compared to area $30^a$ of Figure 8.

Similarly, further clockwise displacement along the direction of arrow *c*, Figure 10, causes the condenser arm 31 of lever 25 to establish a greater capacity effect with fixed plate 30 by overlapping the larger subtended area $30^c$. The angular position $\theta^c$ is a correspondingly greater angle than of the previous lever positions of Figures 8 and 9. It is to be noted that the tip 35 upon which lever 25 rides on the insulated section (33) clears the fixed plate 30 over its rounded corner 30′ in order not to electrically contact the plate and to maintain only a capacitive relationship therewith.

Finally, Figure 11 illustrates the full overlapping of the condenser arm 31 with fixed plate 30, as the subtended dotted area $30^d$ illustrates. The angular position of lever 25 is $\theta^d$ degrees in Figure 11, being the largest angular displacement for lever 25 in the exemplary embodiment.

In a physical embodiment of the invention herein the extent of "rise" by the spiral groove 26 was 0.25 inch producing displacement of lever 25 from its vertical position of Figure 7 to the full capacitive position of Figure 11 for the angular displacement of $\theta^d$ degrees. In this embodiment the width of the lever arm 31 was 0.4 inch and its length between its tip 35 to pivotal section 36 was 1.6 inches. The position of pin 28 with respect to the apex 32′ of the notch position was 0.7 inch.

It is desirable that the effect of frequency change in the oscillator circuit responds in a predetermined manner with respect to the angular rotation of the fine tuning shaft 21. For a given rise in the spiral groove 26, and corresponding angular displacement of the condenser arm 31, with respect to the fixed plate 30, the capacity changes per degree of angular shift of plate 31 depends upon the area of co-action brought into play as illustrated in Figures 7 through 11. The spacing between plates 30 and 31 is maintained constant by the novel design and features of the present invention in order to prevent frequency shifts or distortions due to mechanical variations in its structure during operation of the television receiver. In place of a square "hot" plate 30 for the condenser combination, any desired shape may instead be used to predetermine capacitive changes with angular displacement of the movable condenser plate 31.

Figure 12:
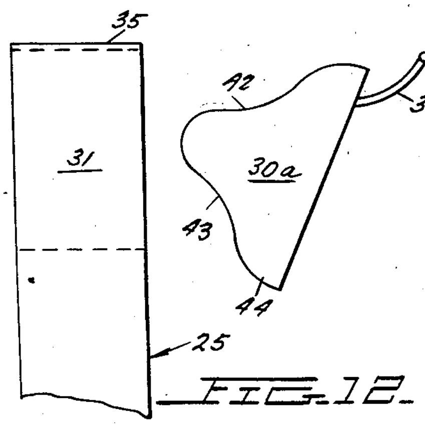
Figures 12 and 13 illustrate modifications of the fine tuning capacitance corresponding to that used in Figures 1 through 11.

Figure 12 illustrates a different shape for plate 30, at 30A. Plate 30A is connected to the oscillator circuit by lead 34 as heretofore. Condenser plate 30A embodies a narrow section 42 that encounters the condenser plate 31 in its initial angular swing from vertical. An expanding curved central portion 44 increases the capacity effect for given angular displacement of movable plate 31; and finally the widest section 43 of plate 30A affords even greater capacity change with angular shift. By proportioning the area, and curvatures 42, 43 and 44 of plate 30A, any desired capacity relation, and correspondingly frequency effect within the range of the invention, may be derived.

Figure 13:
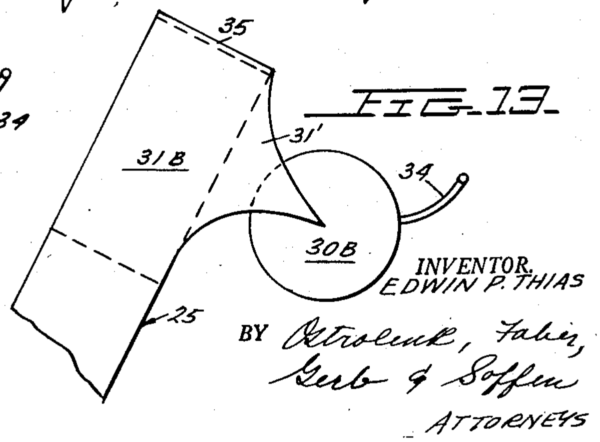

Figure 13 illustrates still a further modification for the co-acting shapes of the fine tuning condenser. The condenser arm of the lever 25 is denoted at 31B having a triangular projection 31′ to capacitively co-act with the fixed condenser plate 30B. The fixed "hot" plate 30B is circular in form in this modification. The co-acting plates 30B and 31B afford a distinctive capacity change characteristic with angular deviation of the lever 25, as may be required in a particular application. Such combination is shown for illustrative purposes to demonstrate the wide variety of capacity change characteristics that may be employed within the principles and scope of the present invention.

Figure 14:
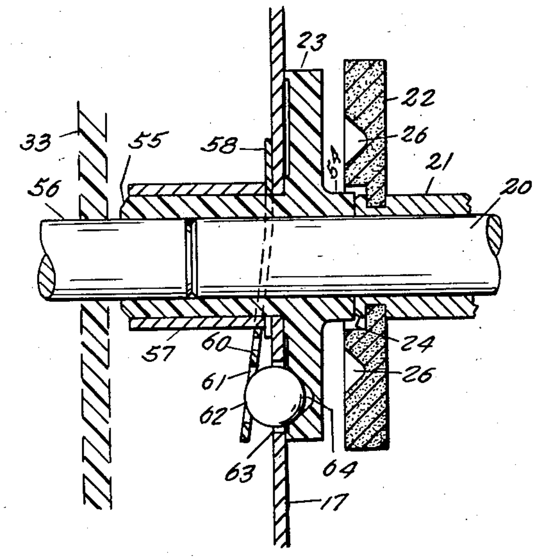
Figure 14 is a cross-sectional view through the detent and fine tuning mechanism as taken along the line 14—14 of Figure 1.

Figure 14 is a vertical cross-sectional view through the tuner mechanism as taken along the line 14—14 of Figure 1. The control shaft 20 extends through the vertical chassis plate 17 into the hubs 54 and 55 of detent disc 23. In this exemplary embodiment of the invention, the disc 23 and its hubs 54, 55 were molded integrally of nylon material to afford a durable rugged insulation member that is also pliable so as to suitably firmly grip control shaft 20 and rotate disc 23 therewith. The shaft 20 is press fitted from hub 54 end into pliable hub 55. A corresponding shaft 56 of the same diameter as shaft 20 is pressed into pliable nylon hub 55, and abuts shaft 20 internally of hub 55. By a suitable press fit dimensioned between the internal diameter of hub 55 and shafts 20 and 56, suitable mechanical integration of the shaft 20 with disc 23 and internal shaft 56 is accomplished.

Shaft 20 is generally of metallic material, whereas in the present embodiment shaft 56 is of insulation material. In fact, shaft 56 which controls the internal discretely arranged electrical components on the several wafers such as 33 within the tuner, may be a molded extension of hub 56 and cast integrally with disc 23 where feasible. In any event the metallic shaft is electrically isolated and otherwise insulated from the electrical circuitry internally of the tuner by the use of the insulation hubs 54, 55 and the extension of the control action from shaft 20 to an insulated shaft 56 for the tuner.

The further important feature of the invention construction is the use of metallic sleeve 57 press fitted upon hub 55 and extending beyond the position of the end of control shaft 20 within hub 55. The metallic sleeve 57 effectively shields the shaft 20 from internal radiations of the tuner, and thereby inhibits radiation from inside the tuner to the outside through the shaft 20 and from the corresponding opening therefor in the chassis plate 17.

The fine turning disc 22 is shown secured mechanically to fine tuning tuning sleeve 21, as described hereinabove in connection with Figure 2. The disc 22, in an exemplary embodiment, was molded of nylon material and had the spiral groove 26 formed into it. The internal end of sleeve 21 is rolled or peened-over at 24, to grip the internal hub of the disc 22 and carry it during rotation of sleeve 21. The rotation of sleeve 21 is transmitted through the fine tuning disc 22 to the lever 25 (not shown) by means of the spiral groove 26 in disc 22.

The detent action on control shaft 20 is afforded through the detent disc 23 having a series of cavities 64 that co-act with steel sphere 62. Sphere 62 projects through the opening 63 in the chassis plate 17, and is spring biased into operative position with disc 23 through spring 60 at its opening 61. The body portion 58 of spring 60 is maintained in suitable contact with chassis plate 17 by the pressure of the end of sleeve 57 thereagainst. In fact, the pressure between sleeve 57, spring 58 and chassis 17 determines the relative friction for the rotation of the disc 23 and correspondingly the control shaft 20. It will thus be noted that the detent disc 23 with its associated hubs 54, 55 serves as an effective bearing for the control shafts 20, 56 with respect to the fixed chassis plate 17. Sleeve 57 determines the frictional effort required to rotate shaft 20 and disc 23 through its engagement of spring body 58 against plate 17. Also, the strength of spring 60 pressing against ball 62 affords a frictional drag on the rotation of detent disc 23, wherein its cups or cavities 64 engage and disengage with the ball 62.

Figure 15:
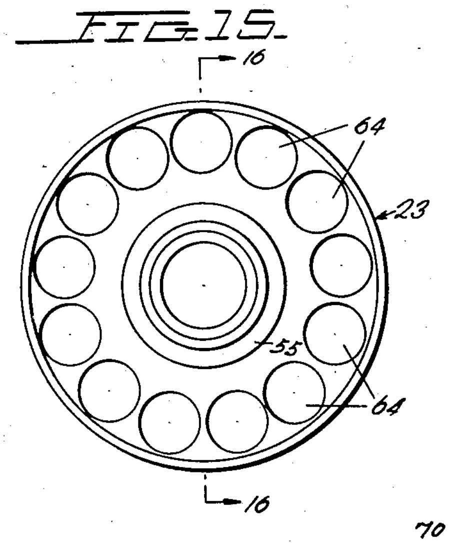
Figure 15 is an end view of the detent disc of the detent device of Figure 14.
Figure 16:
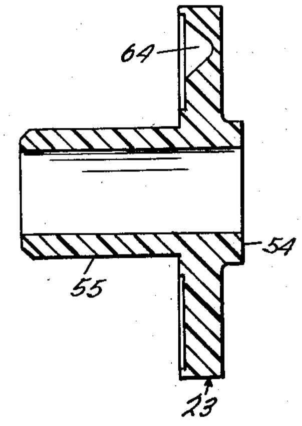
Figure 16 is a cross-sectional view through the detent disc of Figure 15 taken along the line 16—16 thereof.

Figures 15 and 16 illustrate in more detail the detent disc 23, Figure 15, being a full face view of the disc. In the exemplary embodiment, there are thirteen detent cavities 64, 64 circularly arranged equidistantly near the peripheral base of disc 23. Twelve of the positions of cavities 64 correspond to each of the twelve channels 2 to 13 of the V. H. F. band, with the addition of a thirteenth position usable for converting the circuitry of the tuner to U. H. F. reception. It is to be understood that twelve, or a different number of positions, corresponding to the number of cavities 64 may instead be used.

Figure 16 illustrates the intergral molded unit of disc 23 with its associated hubs 54 and 55. The cavities 64 are preferably incorporated in the initial molding of disc 23. The unit 23 with hubs 54, 55 is preferably of nylon material, although any other suitable composition or plastic material may be used. The main point is that it is of rugged insulation material, to isolate electrically the metal control shaft (20) from the inside of the tuner, as is required in direct current or transformerless televeision receivers; and further serves as a bearing, as well as a detent unit; and togethe with metal sleeve 57 (Figure 14) fully shields the shaft 20 from internal radiations of the tuner, as aforesaid.

Figure 17:
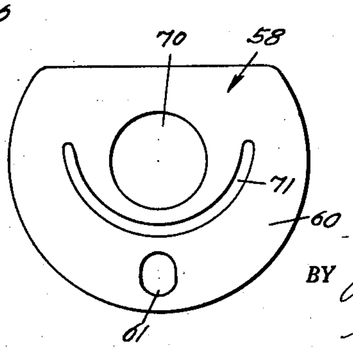
Figure 17 is a plan view of the detent spring incorporated in the device of Figure 14.

Figure 17 illustrates in full face view the detent spring unit 58, seen in side view in Figure 14. The spring 58 in an exemplary embodiment was made of spring steel 0.20 inch thick. The body 58 of the detent spring contains an opening 70 through which the control shaft 20 projects. (See Figure 14.) An arcuate slot 71 is contained in the body of spring 58 in order to permit the detenting spring portions 60 to project from the main plane of spring body 58. As seen in Figure 14, the body 58 of the spring is maintained flat against the vertical chassis plate 17 by the sleeve 57, and the lower portion 60 of the spring is bent away from chassis plates 17 in order that its opening 61 may co-act with the steel ball 62, as shown in Figure 14.

Figures 18, 20:
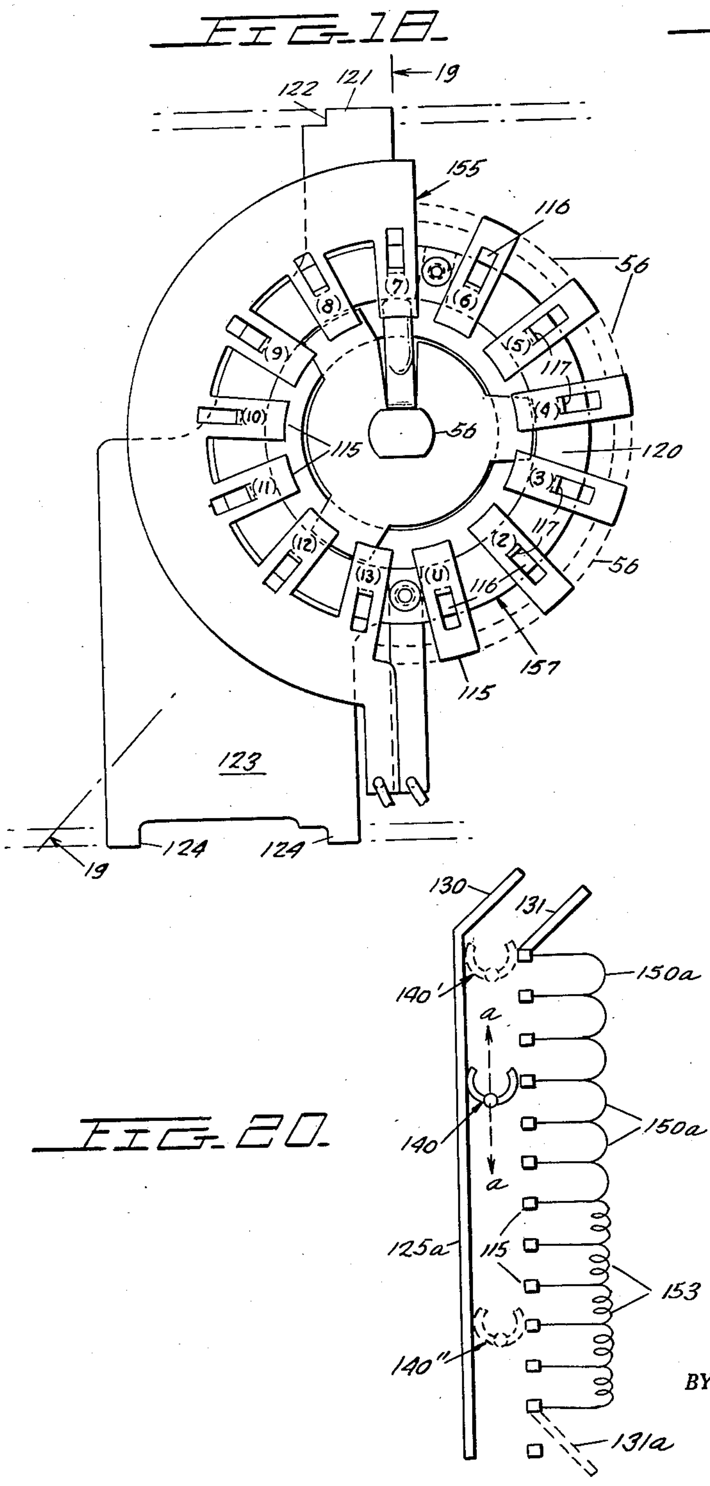
Figure 18 is an end view, in elevation, of the novel rotary spring wafer assembly, as incorporated in the tuner.
Figure 20 is a schematic electrical representation of the electrical wafer switch of Figures 18 and 19, as used in a tuner circuit.
Figure 19:
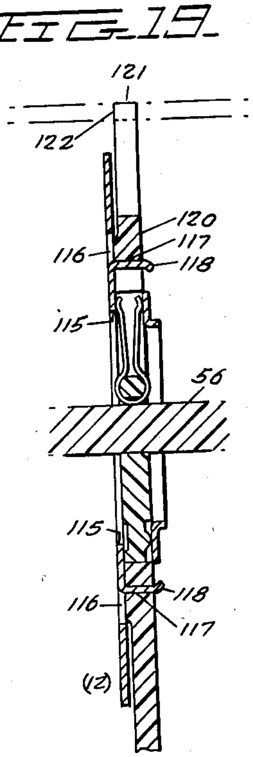
Figure 19 is a cross-sectional view through the electrical wafer switch of Figure 18 taken along the line 19—19 thereof.

Figures 18, 19 illustrate the exemplary embodiment of the invention electrical wafer swith designed for use in a V. H. F. twelve-position television tuner. The wafer 33 of Figs. 1 and 2 may be constructed as per the switch and circuitry therewith now to be described in connection with Figs. 18, 19 and 20. The wafer switch comprises a switch blade 115 corresponding to each of the twelve desired switching positions, and an additional thirteenth blade (U) for converting the circuit to U. H. F. reception. The switch blades 115, 115 are arranged arcuately about the switch and equally spaced, in this instance 30° apart. The twelve switch blades 115, 115 herein correspond to individual channels in the V. H. F. band, namely channels 2 and 13, as marked on each of the switch blades.

Each blade 15 has a slot 16 at its protruding end suitable for electrical interconnection to external circuitry and components. A projection or lug 117 integral with each blade 115 extends through a complementary opening in the insulating support and the extremity of each lug is deformed in such a fashion as to hold the part firmly in position. The tip end 118 of each lug 117 is seen to extend through stator mold or ring 120 through the rear thereof. Blade projections 117, 118 are preferably stamped of the original metal blank containing the switch blades 115, 115 and provide the connection slots 116, 116 in a unitary operation, as is described more fully in the said copending application.

Annular ring 120 is made of moldable composition or plastic material, preferably with a low dielectric constant. The securement of each of the switch blades 115 firmly in position about stator ring 120 is accomplished in the fabrication process and maintained through the projected lugs 117, 117 affixed in the molded ring 120. Each switch blade 115, 115 is maintained rigidly in its predetermined angular position about ring 120 and in accurate radial alignment thereon with respect to the center of the ring.

The body of lugs 117 is transverse to the body of each blade 115 and affords a maximum rigidity to displacement of the blades from the radial position. Projecting tips 118 of lugs 117 are staked over ring 120. Optional means of securing the switch blade assembly 115, 115 to dielectric ring 120 for the purposes herein will be apparent to those skilled in the art. A leg 121 projects integrally from molded stator 120 for the purpose of mounting the wafer switch in an assembly. Leg 121 has a recessed tip 122 to facilitate mounting in a slot of a chassis plate, as will be further set forth hereinafter. A base 123 holds ring 120 integrally, and has legs 124, 124 to grip into slots in a chassis.

A collector ring 125 is provided for the exemplary wafer switch. An important feature of the collector ring 125 is its securement to the stator 120 and its being stationary under all operating conditions. The collector ring 125 has integral projections 126, 126 for securement to the annular ring 120 through eyelets 127, 127. An annular flange or rib 128 projects from the inner edge of collector ring 125 to strength it structurally. A connection lug 130 further extends from metal ring 125 for electrical connection to the exterior circuitry. A further connection lug 131 is provided in the wafer switch integrally extending from the switch blade 115 corresponding to the thermal channel 13 position.

A rotor 132 is provided for the exemplary wafer switch, centrally within the annular ring 120. Rotor 132 is made of insulation material and may be fabricated from a suitable laminate of low dielectric properties, or molded of a desirable plastic or composition material. The exemplary rotor 132 contains three equally spaced arms 133 that guide rotor 132 within the internal surface 134 of the annular stator 120. Rotor 132 has a central oblong opening 135 through which a corresponding central shaft is passed to operate the rotor into any of the angular positions with respect to the switch blades 115, 115. It is understood that the operating shaft 156 cooperating with central opening 135 of rotor 132 is usually connected to a detent, whereby the shaft and the corresponding rotor 132 are displaced into predetermined intermediate angular positions about the wafer switch, generally precisely at the central radial positions of the mounted switch blades 115, 115.

Thus, in a twelve-position V. H. F. tuner, the detent 123 "pockets" the rotor 132 at 30° positions about the wafer switch, resting its contact or operating arm 132 centrally of each of the switch blades 115 for electrical coaction therewith. Into radial channel 36 of rotor 132 is mounted the electrical contacting arm 140 of the exemplary wafer switch. A portion 137 of rotor 132 supports the electrical contacting means 140 to be now described.

Spring arm 140 is an important feature of the present invention. It serves to electrically connect the switch blades 115 selectively to the stationary collector ring 125. The spring arm 140 comprises two opposed cupped or dome shape arms 141, 141 extending from a cylindrical body portion 142. The cylindrical body portion 142 of the switch arm 140 is mounted about pin 137. It is to be noted that the material of switch arm 140 is of a suitable springy metal such as Phosphor bronze. Its design is to create a spring pressure whereby the arms 141, 141 thereof press apart outwardly with respect to each other. Thus, a positive contact is assured between any of the switch blades 115 and the inner surface of collector ring 125.

A continuous electrical circuit is accordingly established between any one switch blade 115 and the metal collector ring 125 through the looped spring arm 140 herein. A thin plating of silver on the contacting surfaces, as is usual switch blade practice, preserves the electrical condition of the coacting surfaces. It is to be noted that the electrical switch arm 140 shown and described herein is readily clipped into position about the pin 137 across its cylindrical base 142. Sufficient longitudinal contact and closeness of the cylinder base 142 of switch arm 140 with respect to pin 137 is desirable to prevent angular twisting of arm 140 from its desired radial position in rotor 132.

In the exemplary embodiment for the electrical switch wafer, the rotor arms 133 are made wider than the spacing between adjacent tips 145 of the switch blades 115. Also, the width of the spring contact arm 140 is likewise made somewhat larger than the spacing between adjacent edges 145 of the blades 115. Thus, with the rotor assembled as shown in Figures 18 and 19 the rotor is captivated within the space defined by the inner surface 134 of the annular stator ring 120, the inner surface of the metallic collector ring 125, and the inwardly projecting tips 145 of each switch blade 115.

In assembling the electrical wafer switch herein, the component sub-assemblies essentially are: the twelve blades 115, 115 preset in molded stator ring 120; the rotor 132 including spring switch arm 140 mounted therein; and the metallic collector ring 125. The rotor arm subassembly is inserted from the back side of stator ring 120, and the collector ring 125 is mounted on the back of stator 20 through eyelets 127, 127. The rotor arm assembly is thus completely captivated, and in full operating conditions, for the wafer switch. The wafer switch assembly is treated as an integral unit for the remainder of the electrical circuit application, as will now be understood by those skilled in the art. Electrical connection to the exemplary wafer switch assembly is made through the projecting connecting lugs 130, 131; and to the projecting slots 116 of blades 115.

Each of the blades 115, 115 of the upper frequency channel band, namely between channels 7 through 13, is connected by an arcuate rib 150, 150. The connecting ribs 150, 150 between the blades 115, 115 of the upper frequency band serve in the final wafer switch as an inductance loop between each of the corresponding channel blade positions. In the fabrication stage of the wafer switch, the loops or ribs 150, 150 also serve to unitize the blade assembly and to position each of the switch blades 115, 115 accurately with respect to the stator ring 120 that is molded, as is set forth in more detail in connection with Figure 7 of the above referred to application. Figures 18 and 19 illustrate the six ribs or loops 150, 150 extending between each of the switch blades 115 for channels 7 through 13.

The electrical counterpart, in a V. H. F. tuner, for the exemplary wafer switch is schematically illustrated in Figure 20. Individual inductance loops 150*a*, 150*a* correspond to the physical ribs or loops 150, 150 of Figures 18 and 19. The physical proportioning of ribs 150, 150 is such as to provide suitable inductances between each of the aforesaid switch blades 115, 115 whereby their interconnection in series (as seen in Figure 20) provides the successive inductance steps between the channel 7 to 13 positions for the tuner.

While the ribs 150, 150 as shown in Figures 18 and 19 are all of identical physical construction, it is to be understood that they may be of differing shapes and dimensions, to conform to differing incremental inductances where desired at the successive steps in the high frequency band of the V. H. F. circuit. The basic feature herein is the provision of inductance loops 150, 150 (equal or diverse) to provide inductances 150*a* for the circuit shown in Figure 20 and the construction which locates the switch blades 115, 116 and affords an inexpensive method of obtaining requisite inductance steps and switch blade operation for the V. H. F. tuner switch.

Figure 19 is a cross-sectional view through the switch engaging position of Figure 18. The spring switch arm 140 is shown clearly establishing firm contact between the inwardly projecting lug end 145 of switch blade 115 to a domed arm 141 of contactor 140; and the annular collector ring 125 at the opposite arm 141 thereof. The captivation of the rotor assembly herein, between the projecting tips 145 of each blade 115 and the stationary collector ring 125 is also evident in Figure 19. A substantial thickness is preferred for the body of annular ring 120. In the exemplary wafer switch, the thickness of stator ring 120, corresponding to the length of lugs 117, was one-eighth inch. Such thickness makes it convenient to design a sizeable cupped spring assembly 140 and contactor arms therefor to provide a rugged spring unit for long service durability. Furthermore, a substantial spacing is correspondingly afforded between the projecting tips 145 of each switch blade 115 and the annular ring 125, whereby capacity therebetween is reduced to a negligible value.

For the same reason, rotor 132 is preferably supported within the wafer switch through arms 133, 133 with open spaces at the rotor periphery, whereby the capacitance effect in the switch is further reduced. Such reduction of capacities of the switch components herein allows for high gain in the design of a V. H. F. tuner using such wafer switches. It is also to be realized that the thicker annular stator ring 120 adds to its inherent strength as a complete stator support for the wafer switch and permits the projections at either side of the switch blade 115 for the purposes herein.

An important feature resides in the elimination of individual spring clips, eyelets and other multiplicity of small parts, and of their requisite individual assembly and positioning in the wafer switch. A unitary metal stamping is preferably used for the fabrication of the invention wafer switch. The stamping 155 embodies all of the switch blades 115, 115 required for the wafer switch, each in its accurate annular relationship and radial position. The stamping 155 also embodies the slots 116 and the projecting lugs 117 within each switch blade 115. Projecting lugs 117 are for engagement with the annular ring 120, and the connection slots 116 are for the switch blade 115 electrical connection to any other portion of the circuit, in the manner of a connection lug.

Each of the switch blades 115, 115 in stamping 155 are interconnected by ribs remaining in the material and constitutes a circular structure. The interconnecting ribs 150, 150 between the upper channels 7 through 13 are seen in stamping 155 and are the inductance ribs 150, 150 described in connection with Figures 1 and 2. Corresponding ribs 156, 156, shown in dotted lines in Figure 18, are provided between the switch blades 115, 115 for channels 2 through 6; with further ribs 156 interconnecting the switch blades of channels 2 and 6 to their contiguous channels 13 and 7, respectively, in the circle of blades 115. The electrical connection lug 131 for channel 13 switch blade is integral with stamping 155 as shown in the drawing.

Since the wafer switch of the present invention embodies flat switch blades 115, this inexpensive fabrication and incorporation in the wafer switch by mass production and automatic means is made feasible. The interconnecting ribs 156, 156 between blades 115, 115 are designed to project beyond the outer rim 157 of the annular stator ring 120.

The projection beyond the molded stator 120 of the connecting ribs 156, 156 of ring 155 is significant. Their projection beyond rim 157 makes ready severance of these ribs feasible. Severance of ribs 156, 156 between the appropriate switch blades 115, 115 is accomplished in any suitable manner, preferably with jigs to minimize the time and labor involved. Each rib 156 is severed in a predetermined relation to a contiguous lug 115.

The exemplary wafer switch shows the switch blades corresponding to channels 7 through 13 as interconnected with the built-in stamped inductance loops 150, 150. It is to be understood, however, that all of the twelve switch blades 115, 115 may be separate and integral for other applications of the invention wafer switches, eliminating the inductance ribs 150, 150 in the manner similar to the elimination of ribs 156, 156 to result in individual switch blades 115 for each switch psition. It is also to be understood that more or less than the exemplary twelve switch blades may be utilized in a full or partial circle. Also, in place of a single connection lug 131 for the blade corresponding to channel 13, other positions are feasible for the connection lug, for more than one lug connector may be provided.

Figure 20 is a schematic electrical representation of the exemplary wafer switch. The circular collector ring 125 is represented by the linear bar 125*a* as the collector for the switch. The twelve switch blades 115, 115 are shown in a linear arrangement, parallel to bar 125*a*. The spring switch arm 140 engages selectively switch blades 115 with stationary collector 125*a*. The contact arm 140 is movable along the linear path of the switches and arm, in the direction indicated by arrows *a*, *a*. The switch blades 115, corresponding to channels 7 through 13, are interconnected by the six inductance ribs 150*a*, 150*a*. The lower frequency band of the V. H. F. channels, corresponding to the contacts between 2 through 7, are interconnected by five inductance coils 153, 153.

With switch arm 140 in the position shown at channel 10, the circuit between output leads 130, 131 of the switch encompasses three of the loops 150*a* in series. Thus, the inductance contribution of the wafer switch when in channel 10 position is predetermined by the inductance of the three loops 150*a* in series. When the switch arm 140 is moved to the upper position 140′ contacting the blade for channel 13, all the inductance in the wafer switch is by-passed. When the switch arm 140 is moved to a lower position as 140′, engaging the blade for channel 4, the wafer establishes an output inductance encompassed by the series connection of three of the outside wound inductances 153, 153 and all six of the inductance loops 150*a*.

It is to be understood that the inductances 153 may all be of different values between the channel positions, as may be the inductance loops at 150*a*, all as predetermined and desired. In other applications of the wafer switch, the elements between the individual switch positions may, instead of inductances, be condensers or resistors, or any other desired circuit element required by the system. Essentially, the invention herein is the provision of a novel wafer electrical multi-position switch for the aforesaid purposes or any other use within the scope of the device, as will be understood by those skilled in the art. A further connection lug 131*a* is shown extending in dotted from the switch blade 115 corresponding to channel 2.

While the present invention has been described and illustrated in connection with exemplary embodiments thereof, it is to be understood that sections of the invention described, such as the wafer switch, the detent mechanism and the fine tuning device, may be used in combination in one tuner design to afford a compact, rugged, inexpensive, stable television tuner; or may be used separately to benefit any particular tuner in which they are employed. In any event, the features and principles of the present invention are subject to modification and diverse application, as will be understood by those skilled in the art, and it is accordingly not intended to be limited except as defined in the appended claims.

I claim:

1. In a television tuner, a housing including a front panel, a metallic tuner control shaft extending through said front panel and terminating just inside said front panel, an insulated drive shaft extending from said control shaft, a fine tuner shaft co-axial with said control shaft and exterior of said front panel, a detent disc mounted on the front exterior of said front panel and having a first hub portion secured to said control shaft and extending to and contiguous with the end of said fine tuner shaft and having a second hub portion connecting said control shaft and drive shaft, a fine tuner disc having a spiral groove and mounted on and rotatable with said fine tuner shaft, a condenser mounted interior of said panel, a lever having one end engaging said spiral groove and operable thereby as said fine tuner disc rotates, said lever being pivotally mounted on said front panel and carrying one plate of said condenser at its other end for movement in accordance with the movement of said fine tuner disc, and spring means including the inherent spring material of said lever for maintaining said lever and condenser plate in predetermined relation.

2. In a television tuner, a housing including a front panel, a metallic tuner control shaft extending through said front panel and terminating just inside said front panel, an insulated drive shaft extending from said control shaft, a fine tuner shaft co-axial with said control shaft and exterior of said front panel, a detent disc mounted on the front exterior of said front panel, a fine tuner disc having a spiral groove and mounted on and rotatable with said fine tuner shaft, a condenser mounted interior of said panel, a lever having one end engaging said spiral groove and operable thereby as said fine tuner disc rotates, said lever being pivotally mounted on said front panel and carrying one plate of said condenser at its other end for movement in accordance with the movement of said fine tuner disc, and spring means including the inherent spring material of said lever for maintaining said lever and condenser plate in predetermined relation.

3. In a television tuner, a housing including a front panel, a metallic tuner control shaft extending through said front panel and terminating just inside said front panel, a fine tuner shaft co-axial with said control shaft, a detent disc mounted on the front exterior of said front panel, a fine tuner disc having a spiral groove and mounted on and rotatable with said fine tuner shaft, a condenser mounted interior of said panel, a lever having one end engaging said spiral groove and operable thereby as said fine tuner disc rotates, said lever being pivotally mounted on said front panel and carrying one plate of said condenser at its other end for movement in accordance with the movement of said fine tuner disc, and spring means including the inherent spring material of said lever for maintaining said lever and condenser plate in predetermined relation.

4. In a television tuner, a housing including a front panel, a tuner control shaft extending through said front panel, a fine tuner shaft coaxial with said control shaft, a detent disc mounted on the front exterior of said front panel, a fine tuner disc having a spiral groove and mounted on the front of said front panel and rotatable with said fine tuner shaft, a condenser mounted interior of said panel, a lever having one end engaging said spiral groove and operable thereby as said fine tuner disc rotates, said lever being pivotally mounted on said front panel and carrying one plate of said condenser at its other end for movement in accordance with the movement of said fine tuner disc, and spring means including the inherent spring material of said lever for maintaining said lever and condenser plate in predetermined relation.

5. In a television tuner, a housing including a front panel, a tuner control shaft extending through said front panel, a fine tuner shaft coaxial with said control shaft, a detent disc mounted on the front exterior of said front panel, a fine tuner disc having a spiral groove and mounted on the front of said front panel and rotatable with said fine tuner shaft, a condenser mounted interior of said panel, a lever having one end engaging said spiral groove and operable thereby as said fine tuner disc rotates, said lever being formed about its central portion to subtend an opening in said panel for pivotal mounting thereon and carrying one plate of said condenser at its other end for movement in accordance with the movement of said fine tuner disc, said end of said lever engaging said spiral groove and said condenser being on opposite sides of said panel and a spring pressed against the lever for stabilizing its pivotal excursion on said panel.

6. In a television tuner, a housing including a front panel, a tuner control shaft extending through said front panel, a fine tuner shaft coaxial with said control shaft, a detent disc mounted on the front exterior of said front panel, a fine tuner disc having a spiral groove and mounted on the front of said front panel and rotatable with said fine tuner shaft, a condenser mounted interior of said panel, a lever having one end engaging said spiral groove and operable thereby as said fine tuner disc rotates, said lever being formed about its central portion to subtend an opening in said panel for pivotal mounting thereon and carrying one plate of said condenser at its other end for movement in accordance with the movement of said fine tuner disc, said end of said lever engaging said spiral groove and said condenser being on the opposite side of said panel and a spring pressed against the lever for stabilizing its pivotal excursion on said panel, said lever having a projection abutting an insulation portion to maintain a predetermined spacing between the plates of said condenser.

References Cited in the file of this patent

UNITED STATES PATENTS

| | | |
|---|---|---|
| 1,924,553 | Hough | Aug. 29, 1933 |
| 2,113,463 | Hall | Apr. 5, 1938 |
| 2,540,824 | Kolks | Feb. 16, 1951 |
| 2,778,229 | Simpson et al. | Jan. 22, 1957 |

FOREIGN PATENTS

| | | |
|---|---|---|
| 525,405 | Great Britain | Aug. 28, 1940 |